United States Patent [19]

Stansbury

[11] Patent Number: 5,665,654
[45] Date of Patent: Sep. 9, 1997

[54] METHOD FOR FORMING AN ELECTRICAL CONNECTION TO A SEMICONDUCTOR DIE USING LOOSE LEAD WIRE BONDING

[75] Inventor: Darryl M. Stansbury, Boise, Id.

[73] Assignee: Micron Display Technology, Inc., Boise, Id.

[21] Appl. No.: 598,882

[22] Filed: Feb. 9, 1996

Related U.S. Application Data

[63] Continuation-in-part of Ser. No. 386,644, Feb. 10, 1995, Pat. No. 5,612,256.

[51] Int. Cl.$^6$ ................................ H01L 21/60
[52] U.S. Cl. ................ 438/23; 438/106; 228/180.5
[58] Field of Search .................... 437/209, 211, 437/212, 214, 215, 216, 217, 218, 219, 220

[56] References Cited

U.S. PATENT DOCUMENTS

| | | | |
|---|---|---|---|
| 4,387,283 | 6/1983 | Peterson et al. | 219/56.21 |
| 4,877,173 | 10/1989 | Fujimoto et al. | 228/1.1 |
| 5,056,702 | 10/1991 | Nakahashi et al. | 437/218 |
| 5,111,989 | 5/1992 | Holdgrafer et al. | 228/110 |
| 5,176,311 | 1/1993 | Levine et al. | 228/179 |
| 5,186,670 | 2/1993 | Doan et al. | 445/24 |
| 5,205,463 | 4/1993 | Holdgrafer et al. | 228/102 |
| 5,229,331 | 7/1993 | Doan et al. | 437/228 |
| 5,302,238 | 4/1994 | Roe et al. | 156/643 |
| 5,347,428 | 9/1994 | Carson et al. | 257/686 |
| 5,381,039 | 1/1995 | Morrison | 257/701 |

OTHER PUBLICATIONS

Microelectronics Packaging Handbook, Tummala, Rao R., pp. 391–400, 1989.

*Primary Examiner*—Kevin Picardat
*Attorney, Agent, or Firm*—Stephen A. Gratton

[57] ABSTRACT

A method for forming an electrical connection between a semiconductor die and a corresponding electrical component mounted within an electrical device is provided. The method includes wire bonding metal wires to the bond pads of the die and then severing the metal wires to form loose leads attached to the bond pads. With the die mounted to the electrical device, the loose leads are bonded to the electrical component using a bonding tip. In an illustrative embodiment, the electrical device is a field emission display package and the electrical component is conductive traces for the package. Advantageous, the method can be used to form the electrical connection between the die mounted in a sealed space and the corresponding electrical component which is outside of the sealed space.

42 Claims, 3 Drawing Sheets

```
┌─────────────────────────────────────────┐
│ FORMING A DIE WITH LOOSE LEADS BY WIRE  │
│ BONDING METAL WIRES TO THE DIE BOND     │
│ PADS AND THEN SEVERING THE METAL WIRES. │
└─────────────────────────────────────────┘
                    │
┌─────────────────────────────────────────┐
│ ASSEMBLING THE DIE IN AN ELECTRONIC     │
│ DEVICE SUCH AS A FIELD EMISSION DISPLAY.│
└─────────────────────────────────────────┘
                    │
┌─────────────────────────────────────────┐
│       BONDING THE LOOSE LEADS TO        │
│      A CORRESPONDING ELECTRICAL         │
│    COMPONENT BY APPLYING HEAT AND       │
│      PRESSURE TO THE LOOSE LEADS.       │
└─────────────────────────────────────────┘
                    │
┌─────────────────────────────────────────┐
│  OPTIONALLY, A LARGE NUMBER OF LOOSE    │
│   LEADS FROM ONE OR MORE DICE CAN BE    │
│   ASSEMBLED ON A SECONDARY SUBSTRATE    │
│        AND SUBSEQUENTLY BONDED TO       │
│  CORRESPONDING ELECTRICAL COMPONENTS    │
│       USING GANG BONDING TECHNIQUES.    │
└─────────────────────────────────────────┘
```

FIGURE 1

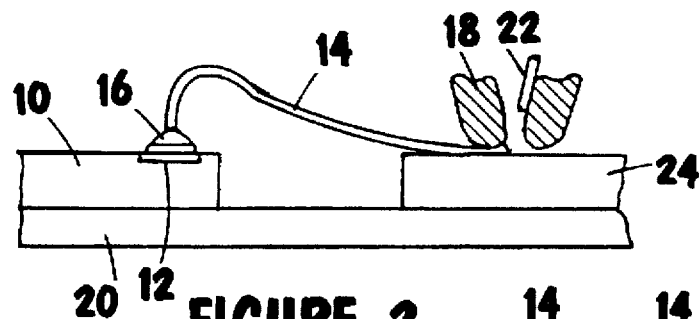
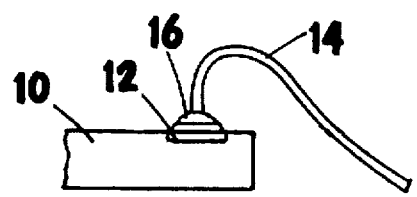
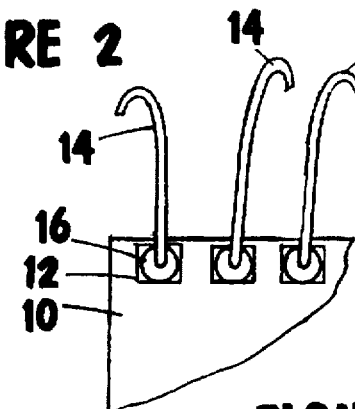
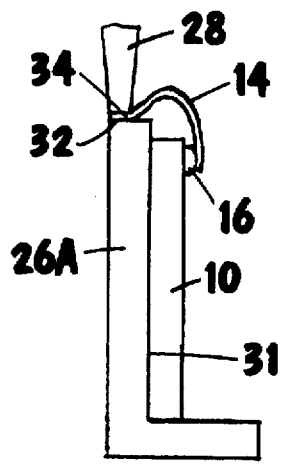
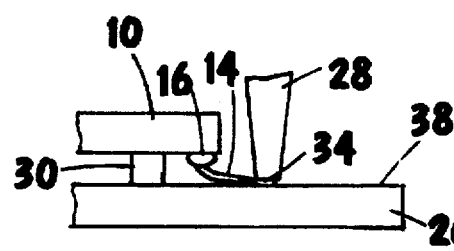
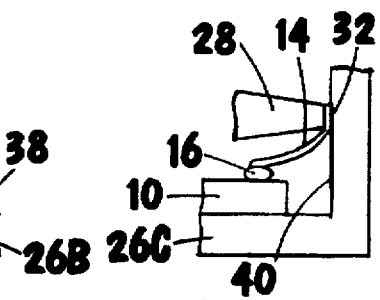
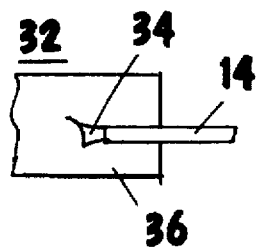

5,665,654

METHOD FOR FORMING AN ELECTRICAL CONNECTION TO A SEMICONDUCTOR DIE USING LOOSE LEAD WIRE BONDING

CROSS REFERENCE TO RELATED APPLICATIONS

This application is a continuation-in-part to U.S. patent application Ser. No. 08/386,644 filed Feb. 10, 1995 now U.S. Pat. 5,612,256.

FIELD OF THE INVENTION

This invention relates to semiconductor manufacture and more particularly to an improved method for forming electrical connections to a semiconductor die using loose leads that are wire bonded to the die bond pads. The method can be used in the fabrication of a field emission displays (FED) or other electronic devices wherein interlevel electrical paths are required. In addition, the method can be used for providing an electrical path with a die mounted in a sealed space such as the vacuum interior of a field emission display package to another component outside of the sealed space.

BACKGROUND OF THE INVENTION

Unpackaged semiconductor dice are used to construct multi-chip modules, field emission displays and other electronic devices. With an unpackaged die, electrical connections must be made between bond pads on the die and other electrical components of the electronic device. For example, a die can be mounted on a printed circuit board (PCB) or lead frame and electrically interconnected to conductive traces.

One method for electrically connecting a semiconductor die to an electronic device such as a PCB, is sometimes referred to as "flip chip mounting". With this method the die is placed circuit side down on the electronic device and bumped bond pads on the die are bonded to solder pads formed on the electronic device. Another method of electrically connecting a die to an electronic device is sometimes referred to as "chip and wire" technology. With this method the die is back bonded to the device and flat bond pads on the die are wire bonded to corresponding bonding sites on the device.

These methods work satisfactorily for most applications. However, in some applications it may be necessary to provide an electrical connection between the die and an electrical component that is on a different plane or is angled (e.g., orthogonal) with respect to the plane of the die. For example, a field emission display (FED) can include conductive traces that electrically connect various elements of the display. Many of the conductive traces are located on different planes, or levels, than the semiconductor dice used to construct the display. In these cases an interlevel connection is typically made between the dice and the conductive traces using metal filled vias.

It would be advantageous to be able to more easily form an electrical path between a semiconductor die and corresponding electrical components such as conductive traces that are located on different surfaces, or planes, than the die. This would eliminate the need for interlevel vias and would simplify the construction of some electronic devices.

Another situation that occurs in the construction of electronic devices, such as field emission displays, is that a semiconductor die must sometimes be located in the interior of a sealed package. For example, field emission displays can be constructed as a sealed package evacuated to a pressure of $1\times10^{-6}$ Torr or less. A baseplate component of the field emission display can be constructed as a semiconductor die mounted within the sealed interior of the package. Here, it is necessary to make multiple electrical connections through the sealing member to the die. It would be advantageous to be able to make these electrical connections without the requirement of complicated electrical connectors or connectors that compromise the sealing member.

In view of the foregoing, it is an object of the present invention to provide an improved method for forming an electrical connection to a semiconductor die. It is another object of the present invention to provide an improved method for constructing field emission displays. It is a further objection of the present invention to provide an improved method for making an electrical connection between a semiconductor die and electrical components located on a different surface or plane than that of the die. It is a still further object of the present invention to provide an improved method for making an electrical connection between a semiconductor die mounted in a sealed space and corresponding components outside of the sealed space. Other objects, advantages and capabilities of the present invention will become more apparent as the description proceeds.

SUMMARY OF THE INVENTION

In accordance with the present invention, an improved method for forming an electrical connection to a semiconductor die is provided. The method, generally stated, includes the steps of: forming loose leads on a semiconductor die; assembling the die in an electronic device; and then bonding the loose leads to corresponding electrical components of the electronic device.

The loose leads are formed by wire bonding metal wires to the bond pads of the die, and then severing the metal wires. A conventional ultrasonic, thermocompression or thermosonic bonding process can be used to wire bond the metal wires to the bond pads. The bonded wires are then severed by a capillary tool, or a shear, as the die is supported on a forming substrate. The length of the leads can be dependent on the application but in general will be much greater than the diameter of the wire.

For assembling an electronic device, the die with the loose leads formed thereon, is mounted to the device. Corresponding electrical components, such as conductive traces, are also formed or mounted to the electronic device. With the die mounted as required, the loose leads are bonded to the corresponding electrical components using a bonding tool such as a heated thermode. Advantageously, the die can be mounted on a different level than the corresponding electrical components, or to electrical components outside of a sealed space for the die. In addition, a large number of loose leads from one or more dice can be placed on a secondary substrate and then simultaneous bonded to electrical components using gang bonding techniques.

BRIEF DESCRIPTION OF THE DRAWINGS

FIG. 1 is a block diagram of the broad steps included in the method of the invention;

FIG. 2 is a schematic cross sectional view of a die having a loose lead being formed on a bond pad thereof in accordance with the invention;

FIG. 3A is a schematic side elevation view of the die formed with loose leads;

FIG. 3B is a plan view of the die formed with loose leads;

FIG. 4 is a schematic side elevation view of the die shown mounted vertically to a surface of an electronic device and illustrating bonding of the loose leads to corresponding electrical components on another surface;

FIG. 4A is an enlarged plan view of a portion of FIG. 4 showing a wedge bond formed between a loose lead on the die and a corresponding electrical component formed as a conductive trace;

FIG. 5 is a schematic side elevation view of the die shown mounted circuit side down to an electronic device and illustrating bonding of the die to corresponding electrical components on a different plane;

FIG. 6 is a schematic side elevation view of the die shown mounted horizontally to an electronic device and illustrating bonding of the die to corresponding electrical components on an orthogonal surface;

DETAILED DESCRIPTION OF THE PREFERRED EMBODIMENT

Figure 7:
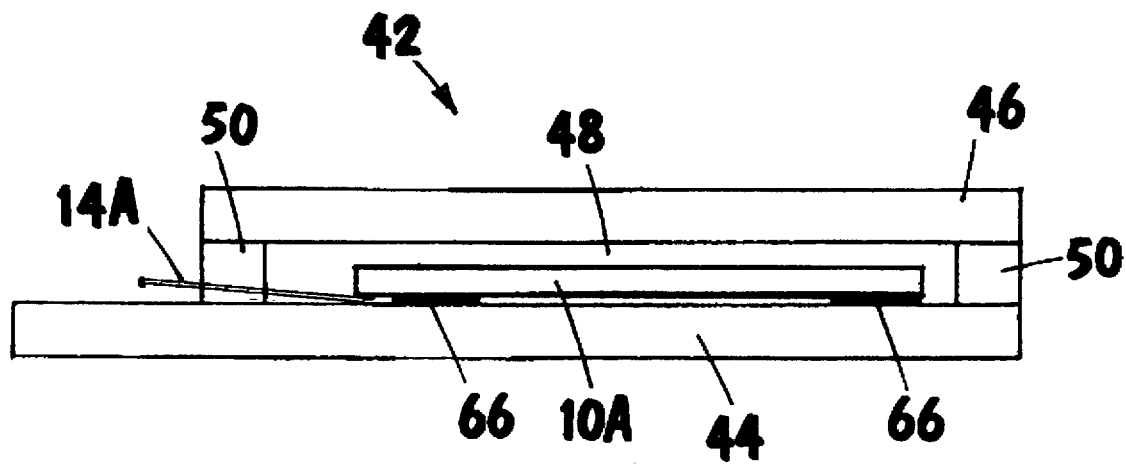
FIG. 7 is a schematic cross sectional view of a field emission display package constructed in accordance with the invention with a die having loose leads placed through a sealing member for the package.

Referring to FIG. 1, a method for forming an electrical connection to a semiconductor die in accordance with the invention, includes the steps of:

A. Forming a die with loose leads by wire bonding metal wires to the die bond pads and then severing the metal wires.

B. Assembling the die in an electronic device such as a field emission display.

C. Bonding the loose leads to a corresponding electrical component by applying heat and pressure to the loose leads.

D. Optionally, a large number of loose leads from one or more dice, can be assembled on a secondary substrate and subsequently bonded to corresponding electrical components using gang bonding techniques.

Referring to FIG. 2, a semiconductor die 10 is provided. The die 10 can be a conventional die that includes various semiconductor devices formed using well known processes. As will be further explained, the die 10 can also be formed as a baseplate for a field emission display. The die 10 includes a pattern of bond pads 12 in electrical communication with the devices and integrated circuits formed on the die 10. In accordance with the method of the invention, loose leads 14 are formed on the bond pads 12 for the die 10. The loose leads 14 include ball bonds 16 formed using a conventional thermocompression or thermosonic ball bonding technique. Alternately in place of ball bonds 16, wedge bonds (not shown) can be formed on the bond pads 12 using an ultrasonic bonding technique.

FIG. 2 illustrates the formation of the ball bonds 16 by thermocompression wire bonding with a wire bonding apparatus. Wire bonding apparatus are well known in the art and are manufactured by Kulicke and Soffa Industries, Inc., Horsham, Pa. and Mitsubishi Denki, Japan. U.S. Pat. No. 3,894,671 to Kulicke, Jr. et al. and U.S. Pat. No. 4,877,173 to Fujimoto et al. disclose representative wire bonding apparatus.

As shown in FIG. 2, the wire bonding apparatus includes a bonding tool 18 and a heated substrate 20. During the wire bonding process the die 10 can be heated to a desired temperature by the heated substrate 20. In addition, the die 10 can be temporarily secured to the heated substrate 20 using an adhesive such as an epoxy. For forming the loose lead 14, a wire 22 is held in the bonding tool 18. The wire 22 can be formed of an aluminum alloy, gold, copper or other metal. Preferably, the wire has a diameter of from 25–150 µm.

At the beginning of the wire bonding process, the end of the wire 22 is heated by an electrical discharge or a hydrogen torch to form a ball of molten metal (not shown). The molten ball is then pressed by the bonding tool 18 against the bond pad 12 on the die 10. Ultrasonic vibrations can also be applied to the molten ball as it is pressed against the bond pad 12. This forms the ball bond 16 which mechanically bonds the end of the wire 22 to the bond pad 12.

Following formation of the ball bond 16, the bonding tool 18 is manipulated to let out a predetermined length of the wire 22. The wire 22 is then severed to form the loose lead 14. Severing the wire 22 can be accomplished using a forming substrate 24 mounted within the wire bonding apparatus. The forming substrate 24 supports the wire 22 as it is severed by movement of the bonding tool 18. There is no bond formed between the wire 22 and the forming substrate 24; the forming substrate 24 merely provides support for severing the wire 22.

As clearly shown in FIGS. 3A and 3B, the loose leads 14 extend from the bond pads 12 of the die 10. The length of the loose leads 14 will depend on the application but in general will be much larger than the diameter of the wires 22 (e.g., length >100×diameter). A predetermined length for the loose leads 14 can be achieved by adjusting the tear length of the wire bonding apparatus. By way of example, this length can be from about a mil to several inches or more. Following formation of the loose leads 14, the die 10 can be used as shown in FIGS. 4–6 to construct an electronic device requiring multi-level or non-planar electrical connections. The die 10 can also be used as shown in FIG. 7 to construct a field emission display package 42.

In FIG. 4, an electronic device includes a supporting substrate 26A. The die 10 is back bonded to a first surface 31 of the substrate 26A in a generally vertical position using an adhesive. The supporting substrate 26A also includes a second surface 32 that is orthogonal to the first surface 31 and orthogonal to the plane of the die 10. A pattern of conductors 36 (FIG. 4A), or other electrical components that require interconnection to the die 10, are formed on the first surface 31. To make a non-planar electrical connection, wedge bonds 34 are formed and bond the loose leads 14 on the die 10 to the conductors 36 (FIG. 4A) on the supporting substrate 26A.

The wedge bond 34 is formed using a bonding tip 28. The bonding tip 28 can be either an ultrasonic, thermocompression, or thermosonic bonding tool of a wire bonding apparatus. For example, with ultrasonic bonding, the bonding tip 28 presses the loose leads 14 to the conductors 36 (FIG. 4A) one at a time and bursts of ultrasonic energy are applied to form the wedge bonds 34. A preferred wire material for forming the wedge bonds 34 using an ultrasonic method is an aluminum-alloy such as aluminum with 1% silicon.

With thermocompression bonding, the bonding tip 28 heats the loose leads 14 and the surfaces of the conductors 36 to a temperature of about 300° C. to 400° C. A preferred wire material for forming wedge bonds 34 using a thermocompression method is gold.

With thermosonic bonding, a combination of heat and ultrasonic power are used to form the wedge bonds 34. With any of the above methods (ultrasonic, thermocompression, thermosonic), a standard bonding tool 28 and wire bonding apparatus, such as specified above, can be used to form the wedge bonds 34.

FIG. 5 illustrates the die 10 mounted circuit side down to a supporting substrate 26B. In this embodiment, the die 10 is secured to spacers 30 on the supporting substrate 26B such as with an adhesive. As before, wedge bonds 34 are formed between the loose leads 14 on the die 10 and conductors 36 (FIG. 4A) formed on a surface 38 of the supporting substrate 26B. In this case, the surface 38 is on a different level but generally parallel to the plane of the die 10.

FIG. 6 illustrates the die 10 mounted to a supporting substrate 26C by back bonding the die 10 to the substrate 26C such as with an adhesive. In this embodiment, the supporting substrate 26C includes a surface 40 that is generally orthogonal to the plane of the die 10. As before, wedge bonds 34 are formed between the loose leads 14 on the die 10 and conductors 36 (FIG. 4A) formed on the surface 40 of the supporting substrate 26C using a bonding tip 28.

Figure 7A:
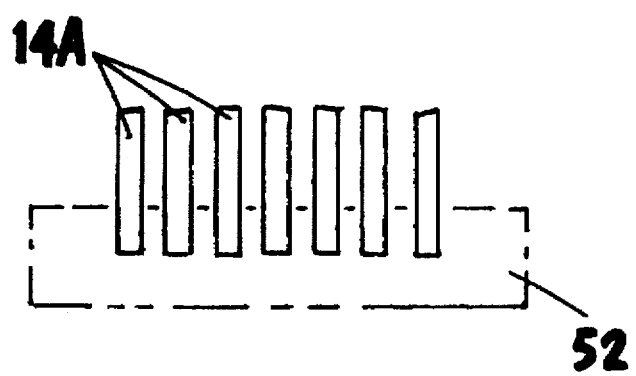
FIG. 7A is a schematic plan view of multiple loose leads temporarily placed on a secondary substrate prior to Gang bonding.

Preferably in each of the illustrative embodiments, the lengths of the loose leads 14 are such that further severing of the loose leads 14 is not required. For some applications the loose leads 14 can be formed in different lengths. In addition, as shown in FIG. 7A, for some applications a large number of loose leads 14A can be assembled on a secondary substrate 52 and then gang bonded.

Referring to FIG. 7, the method of the invention is illustrated in the formation of a field emission display package 42. The field emission display package 42 includes a face plate 44 and a back plate 46. Both the face plate 44 and the back plate 46 can be formed of a transparent material such as glass using techniques that are known in the art. A display screen is formed on an inside surface of the face plate 44 and is viewable through the face plate 44. For example, the display screen can include phosphors in electrical contact with a transparent conductive layer formed of material such as indium oxide, tin oxide or indium tin oxide.

In addition, a base plate 10A is mounted between the face plate 44 and the back plate 46 in an evacuated sealed space 48 formed during formation of the package 42. The base plate 46 is mounted on spacers 66 formed of a glass frit or an adhesive material. The base plate 10A includes field emitter sites (not shown) and an associated grid structure (not shown) formed using known methods. The emitter sites and grid of the base plate 10A can be operated to form a visual image on the display screen. Prior to assembly of the package 42, the base plate 10A also includes loose leads 14A wire bonded to the base plate 10A, as previously described for die 10.

U.S. Pat. No. 5,302,238 to Roe et al.; U.S. Pat. No. 5,229,331 to Doan et al.; and U.S. Pat. No. 5,186,670 to Doan et al., all of which are incorporated herein by reference, disclose methods for fabricating various elements of a field emission display package 42.

During assembly of the package 42, peripheral seal 50 is formed between the face plate 44 and the back plate 46. However, prior to formation of the peripheral seal 50, the base plate 10A is mounted to the spacers 66 and the loose leads 14A can be temporarily assembled as shown in FIG. 7A on a secondary substrate 52. All of the loose leads 14A can then be subsequently bonded to corresponding electrical components outside of the seal 50 using gang bonding techniques. By way of example, gang bonding can employ a single elongated thermode similar to the bonding tip 28 (FIGS. 4-6) previously described.

The peripheral seal 50 can be formed of glass frit deposited as a viscous paste around the base plate 10A and over the loose leads 14A. Following this deposition process, the glass frit can be cured by heating to a temperature of from 200°-600° C. to form a gas tight seal. At the same time that the peripheral seal 50 is being formed, the sealed space 48 can be evacuated to a pressure of $1 \times 10^{-6}$ Torr or less. One method for forming peripheral seal 50 and evacuating the sealed space 48 is disclosed in U.S. patent Ser. No. 08/538, 498, filed Sep. 29, 1995, which is incorporated herein by reference.

Using the above outlined method, the field emission display package 10A, can be constructed with one or more dice 10A each having a required number of loose leads 14A. For example, multiple dice 10A for a field emission display can be formed on a wafer. Such a wafer can include from hundreds to thousands of loose leads 14A. With the method of the invention, the electrical path provided by the loose leads 14A eliminates the need for other types of connectors between the die 10A and electrical devices outside of the sealed space 48.

Thus the invention provides an improved method for forming electrical connections with a semiconductor die and an improved method for forming field emission display packages. While the invention has been described with reference to certain preferred embodiments, as will be apparent to those skilled in the art, certain changes and modifications can be made without departing from the scope of the invention as defined by the following claims.

What is claimed is:

1. A method for forming an electrical connection to a semiconductor die, comprising:

wire bonding a metal wire to a pad of the die;

severing the metal wire to form a loose lead attached to the pad;

assembling the die in an electronic device; and then bonding the loose lead to an electrical component.

2. The method as claimed in claim 1 and wherein bonding the loose lead is by applying heat and pressure to the loose lead using a heated bonding tip.

3. The method as claimed in claim 1 and further comprising assembling the die in a sealed space of the electronic device and bonding the loose lead to the electrical component located outside of the sealed space.

4. The method as claimed in claim 1 and wherein wire bonding the metal wire is with a method selected from the group consisting of ultrasonic, thermocompression and thermosonic bonding.

5. The method as claimed in claim 1 and wherein bonding the loose lead to the electrical component is with a method selected from the group consisting of ultrasonic, thermocompression and thermosonic bonding.

6. The method as claimed in claim 1 and wherein the electrical component is a conductive trace.

7. The method as claimed in claim 1 and wherein the electronic device is a field emission display.

8. A method for forming an electrical connection to a semiconductor die, said method comprising:

wire bonding a metal wire to a bond pad of the die;

severing the metal wire to form a loose lead attached to the bond pad and having a desired length;

assembling the die in an electronic device with the loose lead extending therefrom;

forming a peripheral seal around the die and over the loose lead; and bonding the loose lead to an electrical component located outside of the seal.

9. The method as claimed in claim 8 and further comprising evacuating a sealed space formed by the seal.

10. The method as claimed in claim 9 and wherein the electronic device is a field emission display package.

11. The method as claimed in claim 10 and wherein the die is a base plate for the field emission display package.

12. The method as claimed in claim 11 and wherein the die is mounted to a face plate of the field emission display package.

13. The method as claimed in claim 12 and wherein the metal wire is formed of a metal selected from the Group consisting of aluminum alloys, gold and copper.

14. The method as claimed in claim 13 and wherein the metal wire is formed of aluminum alloyed with silicon.

15. A method for forming an electrical connection to a semiconductor die, said method comprising:
    wire bonding a metal wire to a bond pad of the die;
    severing the metal wire to form a loose lead attached to the bond pad;
    mounting the die to a first surface of an electronic device;
    forming an electronic component on a second surface of the device; and
    bonding the loose lead to the electronic component.

16. The method as recited in claim 15 and wherein the first surface is generally orthogonal to the second surface.

17. The method as recited in claim 15 and wherein the first surface is on a different level than the second surface.

18. The method as recited in claim 15 and wherein the first surface is in a sealed space and the second surface is outside of the sealed space.

19. The method as recited in claim 15 and wherein the die includes field emitter sites and the electronic device is a field emission display package.

20. The method as recited in claim 15 and wherein severing the wire is by providing a forming substrate and tearing the wire at a surface of the forming substrate using a bonding tool.

21. The method as recited in claim 15 and wherein the loose lead has a length of at least 100 times a diameter of the loose lead.

22. The method as recited in claim 15 and wherein a plurality of loose leads are formed and then gang bonded to the electronic component.

23. The method as recited in claim 15 and wherein a plurality of loose leads are formed, assembled on a secondary substrate and then gang bonded to the electronic component.

24. A method for forming a field emission display package comprising:
    wire bonding a metal wire to a pad of a semiconductor die;
    severing the metal wire to form a loose lead attached to the pad;
    assembling the die within the field emission display package; and
    forming an electrical connection between the loose lead and an electrical component for the field emission display package.

25. The method as claimed in claim 24 and wherein the electrical component is a conductive trace.

26. The method as claimed in claim 24 and wherein the die is mounted on a first surface and the electrical component is mounted on a second surface generally orthogonal to the first surface.

27. The method as claimed in claim 24 and wherein the die is mounted on a first surface and the electrical component is mounted on a second surface on a different level than the first surface.

28. The method as claimed in claim 24 and wherein the die is mounted in a sealed space and the electrical component is outside of the sealed space.

29. The method as claimed in claim 24 and wherein the loose lead is formed of a material selected from the group consisting of aluminum alloys, copper and gold.

30. The field emission display as claimed in claim 24 and wherein the die is mounted on a face plate for the field emission display package.

31. A method for forming a field emission display package comprising:
    wire bonding a metal wire to a bond pad of a semiconductor die;
    severing the metal wire to form a loose lead attached to the bond pad;
    forming a first plate and a second plate;
    mounting the die between the first and second plates;
    forming a peripheral seal between the first and second plates and over the loose lead to form a sealed space for the die with the loose lead extending from the sealed space; and
    bonding the loose lead to an electrical component outside of the sealed space.

32. The method as claimed in claim 31 and wherein the die includes a field emitter site in electrical communication with the bond pad.

33. The method as claimed in claim 32 and further comprising evacuating the sealed space.

34. The method as claimed in claim 33 and further comprising evacuating the sealed space as the seal is formed.

35. The method as claimed in claim 34 and wherein a plurality of loose leads are formed and bonded to the electrical component by gang bonding.

36. The method as claimed in claim 35 and wherein the loose leads are assembled on a secondary substrate prior to gang bonding.

37. The method as claimed in claim 36 and wherein the first plate is a face plate having a display screen formed thereon.

38. The method as claimed in claim 37 and wherein the die is mounted on spacers to the face plate.

39. The method as claimed in claim 38 and wherein the seal is formed as glass frit deposited in as a viscous paste in a peripheral pattern.

40. The method as claimed in claim 39 and wherein the paste is cured to seal around the lose lead.

41. The method as claimed in claim 31 and further comprising mounting a plurality of dice between the first and second plates.

42. The method as claimed in claim 41 and wherein the dice are located on a wafer.

* * * * *